US012483212B2

(12) United States Patent
Srinivasan et al.

(10) Patent No.: US 12,483,212 B2
(45) Date of Patent: Nov. 25, 2025

(54) REDUCING OUTPUT HARMONICS AND GROUND BOUNCE IN A TRANSMITTER

(71) Applicant: Silicon Laboratories Inc., Austin, TX (US)

(72) Inventors: Rangakrishnan Srinivasan, Austin, TX (US); Sriharsha Vasadi, Hyderabad (IN); Mustafa Koroglu, Austin, TX (US); Zhongda Wang, San Jose, CA (US); Euisoo Yoo, Austin, TX (US); Eddy Bell, Round Rock, TX (US)

(73) Assignee: Silicon Laboratories Inc., Austin, TX (US)

( * ) Notice: Subject to any disclaimer, the term of this patent is extended or adjusted under 35 U.S.C. 154(b) by 556 days.

(21) Appl. No.: 17/955,171

(22) Filed: Sep. 28, 2022

(65) Prior Publication Data

US 2024/0106398 A1    Mar. 28, 2024

(51) Int. Cl.
*H03F 3/24*    (2006.01)
*H04B 1/04*    (2006.01)

(52) U.S. Cl.
CPC ........... *H03F 3/245* (2013.01); *H04B 1/0475* (2013.01); *H03F 2200/451* (2013.01)

(58) Field of Classification Search
CPC .. H03F 3/245; H03F 2200/451; H03F 3/2173; H04B 1/0475
See application file for complete search history.

(56) References Cited

U.S. PATENT DOCUMENTS

| | | | |
|---|---|---|---|
| 10,256,854 B1* | 4/2019 | Srinivasan | .......... H03F 3/45636 |
| 2008/0278219 A1* | 11/2008 | Lee | ........................... H03F 1/32 |
| | | | 327/530 |
| 2012/0280965 A1* | 11/2012 | Lee | ....................... G09G 3/3696 |
| | | | 345/212 |
| 2013/0009689 A1* | 1/2013 | Santos | ..................... H03F 3/217 |
| | | | 327/392 |
| 2017/0308106 A1* | 10/2017 | Ates | ....................... H03K 3/0315 |
| 2023/0128810 A1* | 4/2023 | Parupalli | ............. H02M 1/0009 |
| | | | 318/503 |

OTHER PUBLICATIONS

Texas Instruments. "CC1352R SimpleLink™ High-Performance Multi-Band Wireless MCU," Jan. 2018—Revised Feb. 2021, 96 pages.

U.S. Appl. No. 17/363,049, filed Jun. 30, 2021, entitled "Dual-Mode Power Amplifier for Wireless Communication," by Ruifeng Sun, et al.

U.S. Appl. No. 17/490,255, filed Sep. 30, 2021, entitled "Dual-Band Operation of a Radio Device," by Euisoo Yoo, et al.

* cited by examiner

*Primary Examiner* — Angelica Perez
(74) *Attorney, Agent, or Firm* — Trop, Pruner & Hu, P.C.

(57) ABSTRACT

In one aspect, an apparatus comprises: a driver circuit to receive first and second ramp signals and output first and second drive signals under control of a first bias signal and a second bias signal, the first bias signal having a first edge and a second edge, the second edge having a different edge rate than the first edge, the second bias signal having a third edge and a fourth edge, the third edge having a different edge rate than the fourth edge; and an output circuit coupled to the driver circuit, the output circuit comprising at least one first active device to be driven by the first drive signal and at least one second active device to be driven by the second drive signal, where the output circuit is to amplify and output a radio frequency (RF) signal.

20 Claims, 12 Drawing Sheets

REDUCING OUTPUT HARMONICS AND GROUND BOUNCE IN A TRANSMITTER

BACKGROUND

Single-ended Class D amplifiers are inherently non-linear and have a high ground bounce. This non-linearity affects both radiated/conducted harmonic emissions. While conducted harmonic emissions can be controlled with a matching network for harmonic filtering, it is not the case with the radiated harmonic emissions. For radiation, the harmonic currents through power amplifier (PA) outputs and supply pins, and nearby general-purpose input output (GPIO) pins and ground systems can radiate out through traces to affect emissions. This can often bypass the harmonic matching network. Harmonic current control in the transmitter on chip is the preferred approach.

Further, harmonic resonance due to bondwires in the package and circuit board traces is unavoidable. A high ground bounce can lead to issues of control of the transmitter itself due to differentials between the controller ground and transmitter ground. It can also lead to undesired radiation through GPIO traces.

SUMMARY OF INVENTION

In one aspect, an apparatus comprises: a driver circuit to receive first and second ramp signals and output first and second drive signals under control of a first bias signal and a second bias signal, the first bias signal having a first edge and a second edge, the second edge having a different edge rate than the first edge, the second bias signal having a third edge and a fourth edge, the third edge having a different edge rate than the fourth edge; and an output circuit coupled to the driver circuit, the output circuit comprising at least one first active device to be driven by the first drive signal and at least one second active device to be driven by the second drive signal, where the output circuit is to amplify and output a radio frequency (RF) signal.

In an embodiment, the apparatus further comprises a control circuit to generate the first bias signal and the second bias signal based at least in part on a first configuration setting. The apparatus may further include a non-volatile storage to store the first configuration setting, the first configuration setting comprising a multi-bit value to control the edge rate of at least the second edge and the third edge. The non-volatile storage can be written during manufacture with the first configuration setting. The control circuit may generate the second bias signal having an asymmetric non-overlap with the first bias signal. The control circuit may generate the asymmetric non-overlap according to a second programmable configuration setting. The control circuit may include a calibration circuit to receive a clock signal and to generate a first non-overlap signal and a second non-overlap signal, based on the clock signal and the second configuration setting.

In an embodiment, the calibration circuit comprises: a first path having a first logic circuit and a first delay circuit to generate the first non-overlap signal; and a second path having a second logic circuit and a second delay circuit to generate the second non-overlap signal. The first delay circuit has a first programmable delay and the second delay circuit has a second programmable delay, the first programmable delay different than the second programmable delay. The driver circuit may include: a first stack of driver devices to receive the first bias signal the first non-overlap signal, and a first ramp signal, the first stack of driver devices to output the first drive signal; and a second stack of driver devices to receive the second bias signal, the second non-overlap signal, and a second ramp signal, the second stack of driver devices to output the second drive signal.

In another aspect, a method includes: receiving, in a driver circuit of a transmitter, first and second ramp signals and outputting first and second drive signals under control of a first bias signal and a second bias signal, the first bias signal having a first edge and a second edge, the second edge having a different edge rate than the first edge, the second bias signal having a third edge and a fourth edge, the third edge having a different edge rate than the fourth edge; and in a power amplifier of the transmitter, amplifying and outputting a RF signal, the power amplifier comprising at least one active device driven by the first drive signal and at least one second active device driven by the second drive signal.

In an embodiment, the method further comprises: generating the first bias signal and the second bias signal; and controlling the edge rate of at least the second edge and the third edge based at least in part on a first configuration setting, the first configuration setting stored in a non-volatile memory. The method also may include: generating the first bias signal with the second edge having a slower edge rate than the first edge, the first edge comprising a rising edge and the second edge comprising a falling edge; and reducing at least one of ground bounce or harmonic current by providing the second edge having the slower edge rate than the first edge.

In an embodiment, the method further may include: generating the first bias signal having an asymmetric non-overlap with the second bias signal; and reducing at least one of ground bounce or harmonic current by providing the first bias signal having the asymmetric non-overlap with the second bias signal. The method also may include: controlling at least one of a rise time or a fall time of the first bias signal and the second bias signal according to a first configuration setting; and controlling a non-overlap of the first bias signal with the second bias signal according to a second configuration setting. The method also may include outputting the RF signal comprising a single-ended RF signal, the power amplifier comprising a single-ended Class D amplifier.

In yet another aspect, a wireless device includes: a baseband circuit to receive message information and process the message information; RF circuitry coupled to the baseband circuit to convert the message processed information into a RF signal; and a power amplifier coupled to the RF circuitry, the power amplifier having a first node to couple to a supply voltage node and a second node to couple to a ground voltage node, the power amplifier to receive and amplify the RF signal. The power amplifier may include: a first stage to receive first and second ramp signals and output first and second drive signals under control of a first bias signal and a second bias signal, at least one of the first bias signal or the second bias signal having at least one asymmetric edge rate; and a second stage comprising at least one first active device to be driven by the first drive signal and at least one second active device to be driven by the second drive signal, to output the RF signal comprising a single-ended RF signal.

In an embodiment, the wireless device further comprises a non-volatile storage to store a first configuration setting to cause the first bias signal and the second bias signal to have the at least one asymmetric edge rate. The non-volatile storage further is to store a second configuration setting to cause a non-overlap between the first bias signal and the second bias signal, the wireless device further comprising a calibration circuit to generate a first non-overlap signal and a second non-overlap signal based at least in part on the second configuration setting, where the first stage is further to receive first non-overlap signal and the second non-overlap signal and provide the first drive signal and the second drive signal to the second stage based at least in part on the first and second non-overlap signals.

In an embodiment, the power amplifier comprises a single-ended Class D amplifier, and during transmission of the RF signal a ground bounce at the ground voltage node is to be less than approximately 100 millivolts.

DETAILED DESCRIPTION

Embodiments enable single-ended Class D power amplifier designs to leverage higher amplifier efficiency and reduced bill of materials costs, while reducing radiated output harmonics and ground bounce. In contrast, existing techniques usually rely on differential implementations of Class-D and/or single-ended/differential implementations of Class A-B (or more linear) architectures at the cost of efficiency.

In one or more embodiments a single-ended Class D amplifier is provided with harmonic control to help minimize harmonic currents (and thereby radiation) and lower ground bounce. More specifically, the amplifier may be controlled having programmable rise/fall times and programmable non-overlap time of the Class D amplifier. To reduce the impact on efficiency with slower rise/fall times (avoiding shoot through current), the non-overlap delay in the Class D driver may be programmably increased. Embodiments may further enable self-resonance due to the package and traces to be overcome by lowering on-chip currents. Still further, as shown below, a notch frequency may be programmed around a self-resonance frequency to lower the current and overcome any amplification effects.

Figure 1:
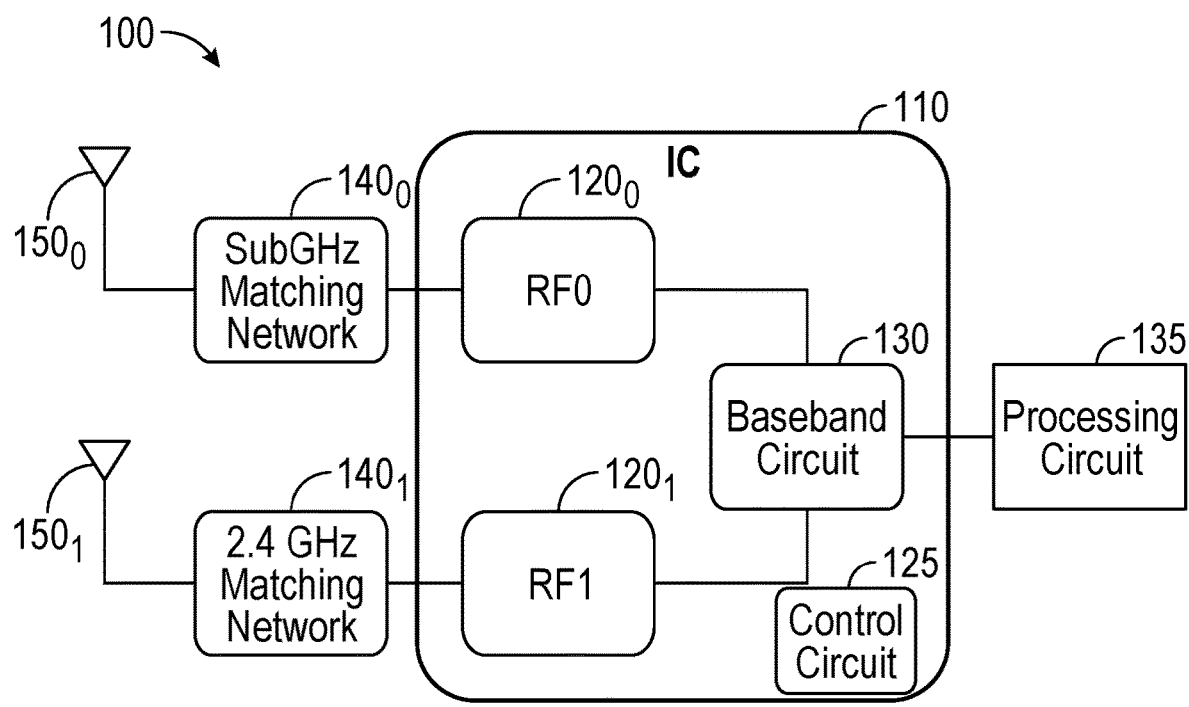
FIG. 1 is a block diagram of a system in accordance with an embodiment.

Referring now to FIG. 1, shown is a block diagram of a system in accordance with an embodiment. As shown in FIG. 1, system 100 may be any type of wireless-enabled device. While embodiments herein may be particularly adapted for use in Internet of Things (IoT) devices, understand embodiments are not limited in this regard, and other wireless-enabled devices such as various consumer portable devices including portable computers, smartphones, media players, and so forth, also may leverage embodiments.

In the high level shown in FIG. 1, system 100 includes an integrated circuit 110. In embodiments, integrated circuit 110 may be a main controller for system 100, such as a microcontroller unit (MCU). In other cases, IC 110 may be implemented as a standalone transceiver that has transmit and receive capabilities. In any event, in the FIG. 1 implementation IC 110 has multiple independent RF signal processing paths, including a first RF front end circuit $120_0$ and a second RF front end circuit $120_1$. At a high level, RF front end circuits 120 (generically) may include various circuitry to receive and transmit RF signals and further to interface with additional signal processing circuitry. As such, RF front end circuits 120 may include frequency translation circuitry to down-convert/upconvert signals between RF and a lower frequency such as an intermediate frequency (IF) and/or baseband. In addition, RF front end circuits 120 further may include signal conditioning circuitry such as amplifiers and/or other gain control circuitry, filtering circuitry and so forth. In some cases, there may be additional circuitry within the separate RF front end circuits, such as mixers or other downconversion circuitry.

Still with reference to FIG. 1, a control circuit 125 is present and may be configured to control operation. For example, control circuit 125 may dynamically enable and disable selected slices of RF front end circuits 120, depending on a desired protocol for a given environment. Such operation may result from a negotiation with a network component. In addition, control circuit 125 may control configuration of transmit and receive operations, e.g., including to reduce unwanted harmonic transmissions and ground bounce as described herein. Further details of control circuit 125 operation are described below.

As further shown in FIG. 1, RF front end circuits 120 interconnect with a baseband circuit 130. While shown as a single baseband circuit, understand that at least portions of baseband circuit 130 may be separately implemented for the different signal processing paths. For example, different modem circuitry may be provided to enable modulation and demodulation of signals of different wireless protocols and so forth. In some embodiments, baseband circuit 130 may be implemented as a digital signal processor (DSP) or other digital circuit to recover message information from digitized signals obtained from received RF signals.

In turn, baseband circuit 130 may communicate digital information with a processing circuit 135, which may be a main processor such as a host processor of system 100. In other cases, understand that processing circuit 135 may be present within IC 110, and may be implemented as an MCU. Of course, additional circuitry may be present in IC 110 and system 100 but is not shown for ease of illustration in FIG. 1.

As further shown in FIG. 1, IC 110 couples to multiple independent matching networks $140_{0,1}$. In particular embodiments, matching networks 140 may be implemented off-chip. By providing external matching networks separate from IC 110, the size, complexity, and cost of IC 110 may be reduced. Furthermore, greater flexibility may be realized by providing off-chip matching, since a much larger range of frequencies can be accommodated in this way.

In particular implementations described herein, matching network $140_0$ may be configured to provide sub-GHz matching, while matching network $140_1$ may be configured to provide 2.4 GHz matching. While different implementations of matching networks 140 are possible, in this high-level view of FIG. 1, understand that matching networks 140 can be implemented as LC circuits.

As further shown, each matching network 140 couples to a separate antenna 150$_{0,1}$, respectively. In embodiments, each antenna 150 may be configured to receive signals of a particular band or bands and may be differently configured. Understand while shown at this high level in the embodiment of FIG. 1, many variations and alternatives are possible. For example, in some cases, at least one of matching networks 140 may be included within IC 110. Also, a single antenna (e.g., a dual-resonant antenna) may be used, with a RF switch coupled between matching networks 140 and this antenna. Also, in other cases only a single RF front end circuit and matching network may be present.

Figure 2:
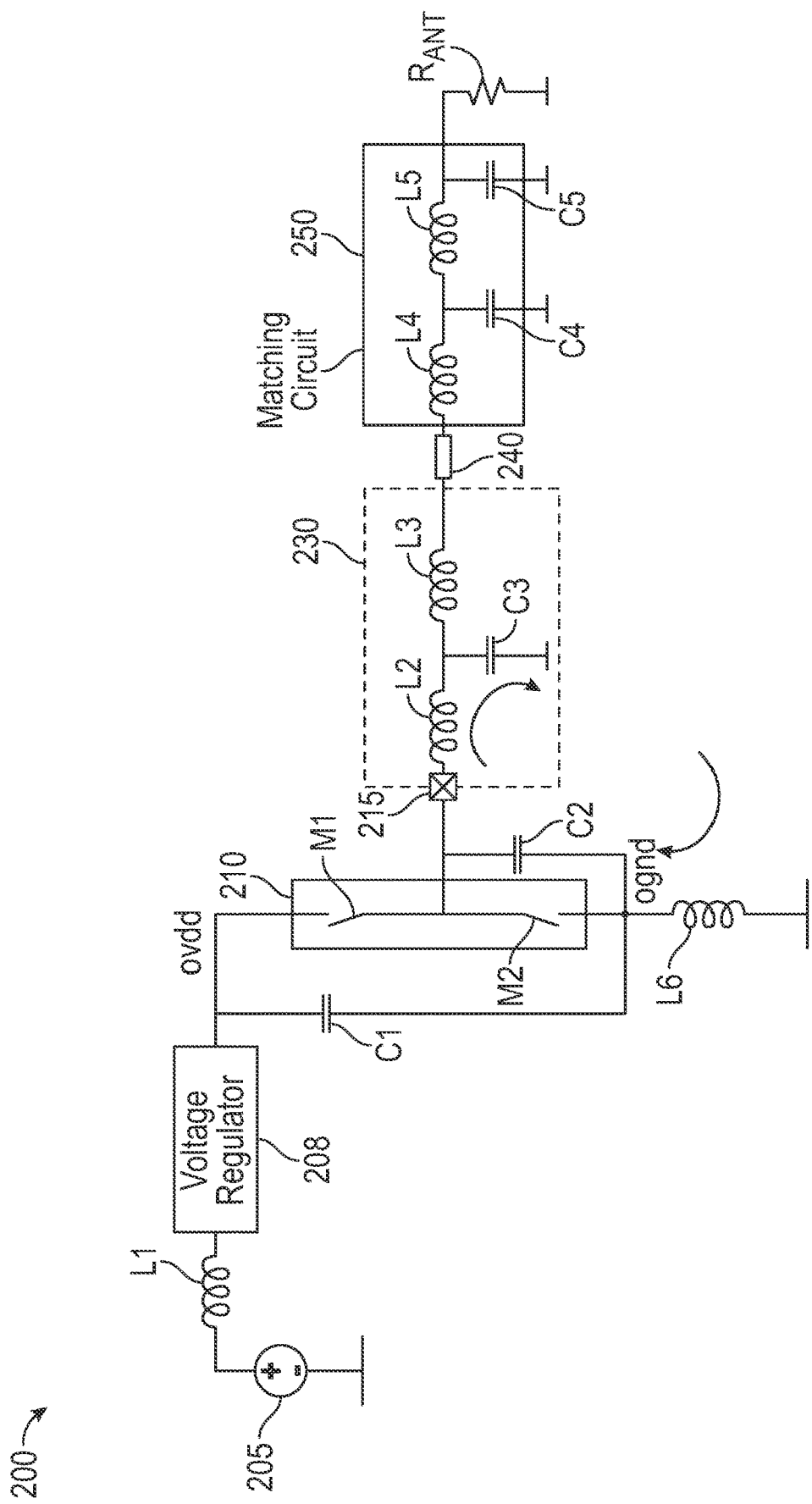
FIG. 2 is a schematic diagram of an output circuit illustrating output harmonic and ground bounce conditions.

Referring now to FIG. 2, shown is a schematic diagram of an output circuit illustrating output harmonic and ground bounce conditions. As illustrated in FIG. 2, an output circuit 200 includes a power amplifier (PA) 210, which may be implemented as a single-ended Class D amplifier. In the high-level schematic of FIG. 2, PA 210 is illustrated to include serially coupled metal oxide semiconductor field effect transistors (MOSFETs), namely a first MOSFET M1 and a second MOSFET M2. In various implementations, MOSFET M1 may be a P-channel MOSFET (PMOS) that couples to a supply voltage level and MOSFET M2 may be a N-channel MOSFET (NMOS) that couples to a circuit ground voltage level. Understand that PA 210 is shown at a high level, and in many implementations, instead of a single MOSFET, there may be stacks of amplifier MOSFETS, and furthermore there may be multiple amplifier slices, where each slice includes multiple stacks called stripes. Understand while shown in this implementation with MOSFETs, in other cases any active device such as other transistors may be used.

As illustrated, a first capacitor C1 couples in parallel with PA 210, and a second capacitor C2 couples between an output pin 215 coupled to an output node of PA 210 and a ground node (ognd). As further illustrated, an inductor L6 couples between this ground node and a circuit ground node. A voltage regulator 208 couples via an inductor L1 to a voltage source 205 and provides a supply voltage level to the supply voltage node.

With respect to the output of PA 210, a bondwire model 230 illustrates parasitic capacitance and inductance of a bondwire, which in conjunction with a matching circuit (e.g., matching network) 250 presents a high input impedance at high frequencies (e.g., at 15 gigahertz (GHz)), in contrast to the low impedance created at the PA output at this frequency due to self-resonance of bond wire 230 with its parasitic capacitance. As illustrated, bondwire model 230 includes a pair of series-coupled inductances L2 and L3 (e.g., at a level of approximately 0.5 nano-Henries (nH)) and a capacitance C3 (which may be at a level of 0.25 picoFarads (pF). Thereafter, a trace 240 having a given length connects the output of PA 210 to a matching circuit 250 and can also impact the self-resonance frequency by shifting down to the region around 12 GHz. Matching circuit 250 may be implemented with serially coupled inductors L4, L5 (which may be at a level of 3 nH and 8.2 nH, respectively) and parallel capacitors C4, C5 (which may be at a level of 1.0 pF and 0.3 pF, respectively) that presents a matched impedance to an antenna resistance $R_{ant}$.

With this arrangement, the output of PA 210 may be a square wave having harmonic content where the harmonics are at approximately 1/N, where N is the order of the harmonic. At a frequency of 12 GHz, an input impedance is approximately zero, due to the self-resonance of bondwire 230 and trace 240. In this situation, a high level of current may be output via pin 215. Some of this current comes back to the chip via the bondwire that couples capacitor C2 to the ground node, which creates an undesired ground bounce. For example, at a frequency of 12 GHz this ground bounce may be 300 millivolts (mV). Note further that the resonance at trace 240 can shift with a length of the trace and may be around a level of a fifth harmonic (H5). This harmonic has low H5 impedance and high H5 harmonic currents.

Embodiments may be implemented to reduce the output harmonics and ground bounce. More specifically, in various implementations slope controls that are provided as control signals to the output transistors of a power amplifier may be controlled as described herein to reduce harmonic current and ground bounce. In addition, the different control signals (for the PMOS and NMOS devices) can be controlled to have a programmable non-overlap to further reduce harmonic current and ground bounce.

Figure 3A:
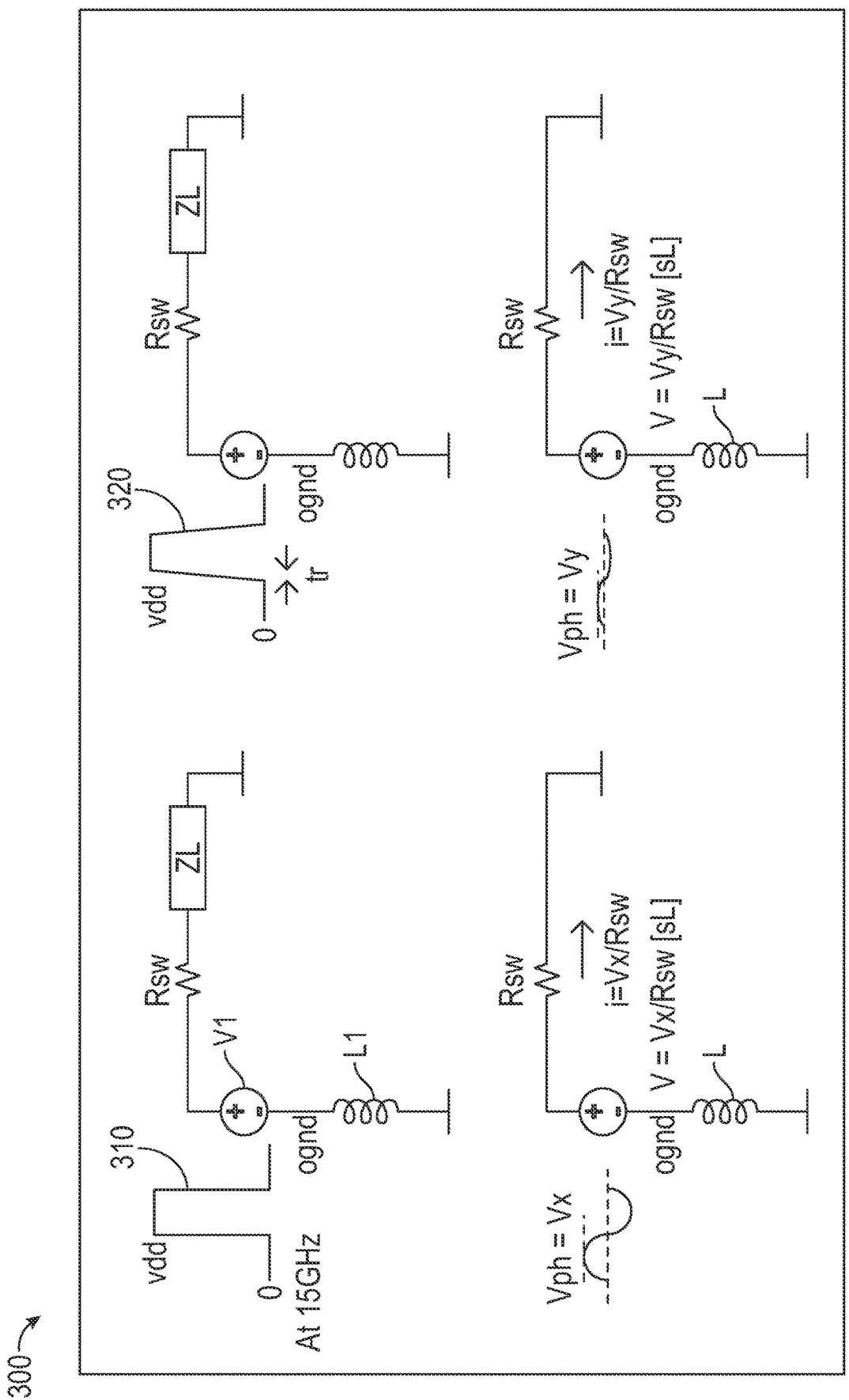
FIG. 3A is a graphical illustration describing ground bounce control using an embodiment.
Figure 3B:
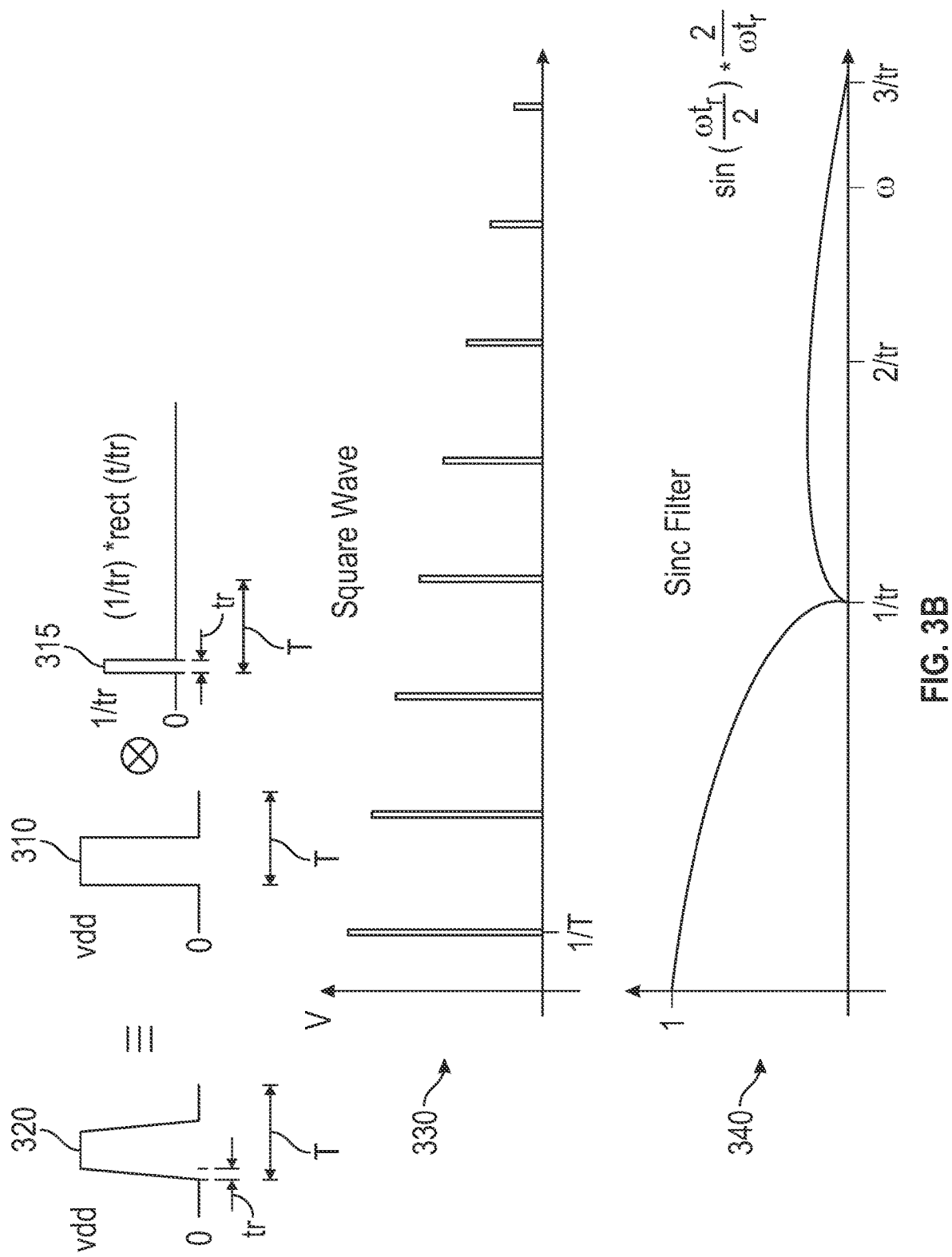
FIG. 3B is a graphical illustration of generation of a control signal in accordance with an embodiment.
Figure 3C:
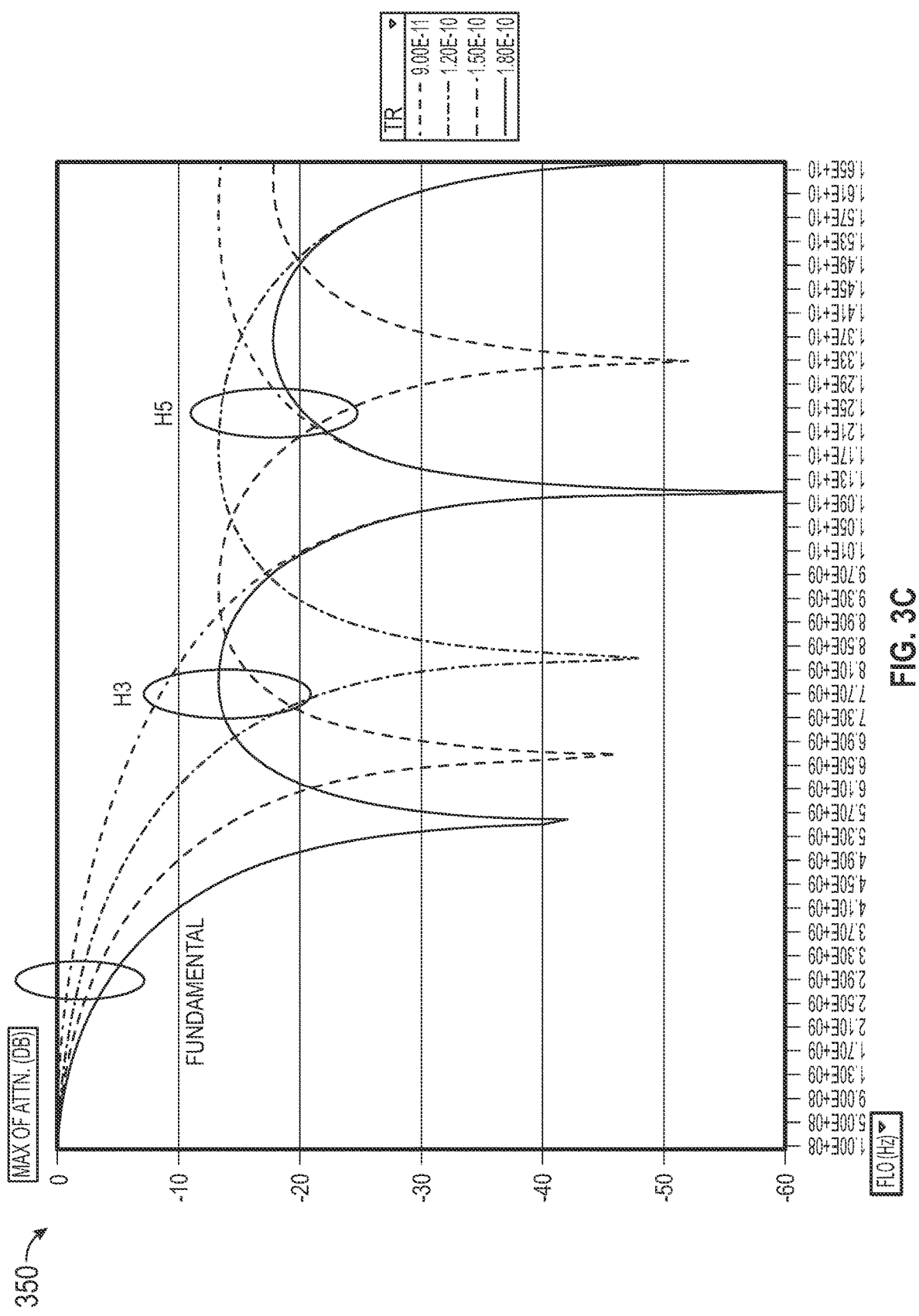
FIG. 3C is a graphical illustration of attenuation as a function of frequency, using programmable control signals in accordance with an embodiment.

Referring now to FIGS. 3A-3C, shown is a graphical illustration describing the reasons for ground bounce and a manner of reducing such ground bounce using an embodiment. As illustrated in the left portion of FIG. 3A, an output circuit 300 is represented in schematic form in a nominal form, having potentially high harmonics and ground bounce. As seen at the top left portion of FIG. 3, output circuit 300 has a voltage source V1 that couples to an inductor L1 and further couples to a PA with a switching resistance ($R_{sw}$). In turn, the PA output is provided to an output load, represented as an output impedance (ZL).

In this arrangement, clock signal 310 illustrates a typical control signal that controls the switching of the output MOSFETs of the PA. As shown, at a switching frequency of 2.4 GHz, a square wave 310 results, and rich in harmonics. As shown further, representations of voltage, current components, and the circuit at 12 GHz are illustrated at the bottom left. In this example, 12 GHz is the self-resonant frequency of bondwire 230 with trace 240, and is around the 5$^{th}$ harmonic of the transmitter output, leading to amplification of the 5$^{th}$ harmonic current and thereby the ground bounce. With this arrangement in which the output voltage is a peak voltage ($V_{pk}$) of Vx, significant harmonic voltage and higher harmonic currents exist, leading to higher ground bounce, in the order of 300 millivolts.

In contrast, with reference to the right-hand bottom side of FIG. 3A, the same circuit arrangement, when provided with a clock signal 320 in accordance with an embodiment that has slower rise and fall times (where the rise time is represented as tr in FIG. 3A), a lower harmonic voltage of Vy results, which may be substantially smaller, e.g., around 100 millivolts, leading to lower harmonic current and thus lower ground bounce. Furthermore, by providing a shorter trace between a PA output and a matching network there may be a resonance shift to a higher frequency (e.g., 12 GHz), away from the fifth harmonic of the 2.4 GHz transmit output signal.

Referring now to FIG. 3B, shown is a diagram illustrating signal processing using a clock signal having slower edges as described herein. As shown in FIG. 3B, an effective LO waveform now can be considered as a convolution in time of an original LO waveform 310 (as shown on the left side of FIG. 3) with a rectangular pulse function 315. The square wave is multiplied by a sinc function 330 in the time domain to provide attenuation benefits, shown as a sinc filter 340.

Referring now to FIG. 3C, shown is a graphical illustration of harmonic attenuation that may be realized in accordance with an embodiment. As shown in FIG. 3C, in illustration 350 attenuation is denoted on the Y-axis and frequency on the X-axis. By programmably controlling a rise/fall time (tr) using edge control signals as described herein, a notch at a self-resonant frequency may be placed around H5, reducing harmonic currents and thereby radiation. Depending on implementation, there may be a tradeoff between edge control (tr) and attenuation of harmonics. A given designer may balance harmonic control with fundamental output power degradation. Note that in FIG. 3C, the harmonic attenuation illustrated is an ideal representation; in practice, the illustrated notches may not be as deep owing to switching resistance and ground impedance in actual circuits.

Figure 4A:
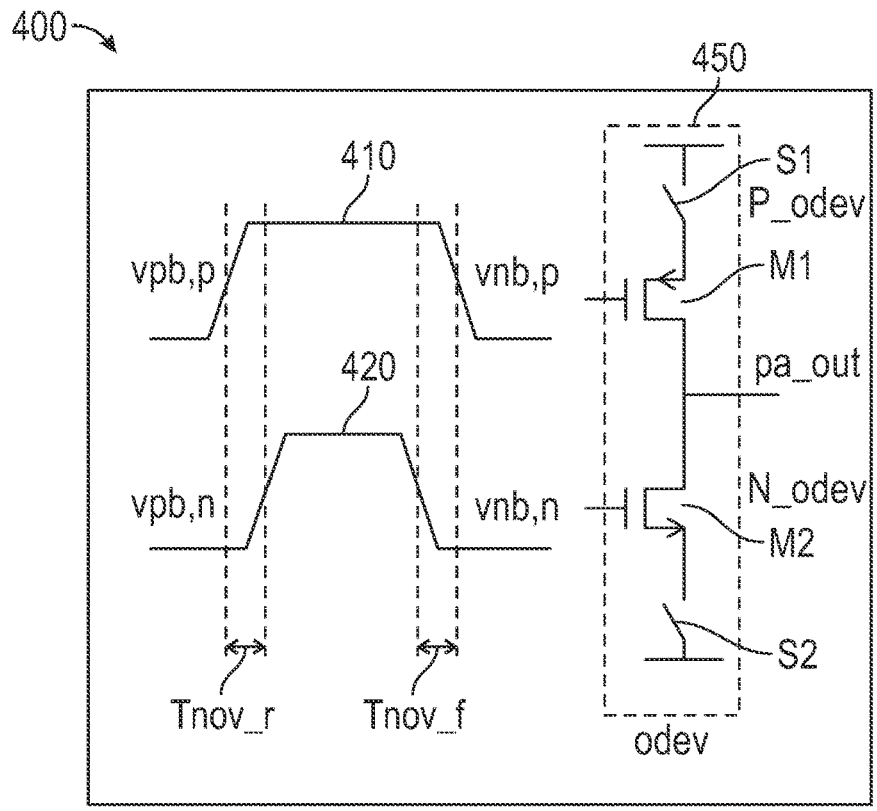
FIG. 4A-4C are timing diagrams illustrating control signals in accordance with an embodiment.
Figure 4B:
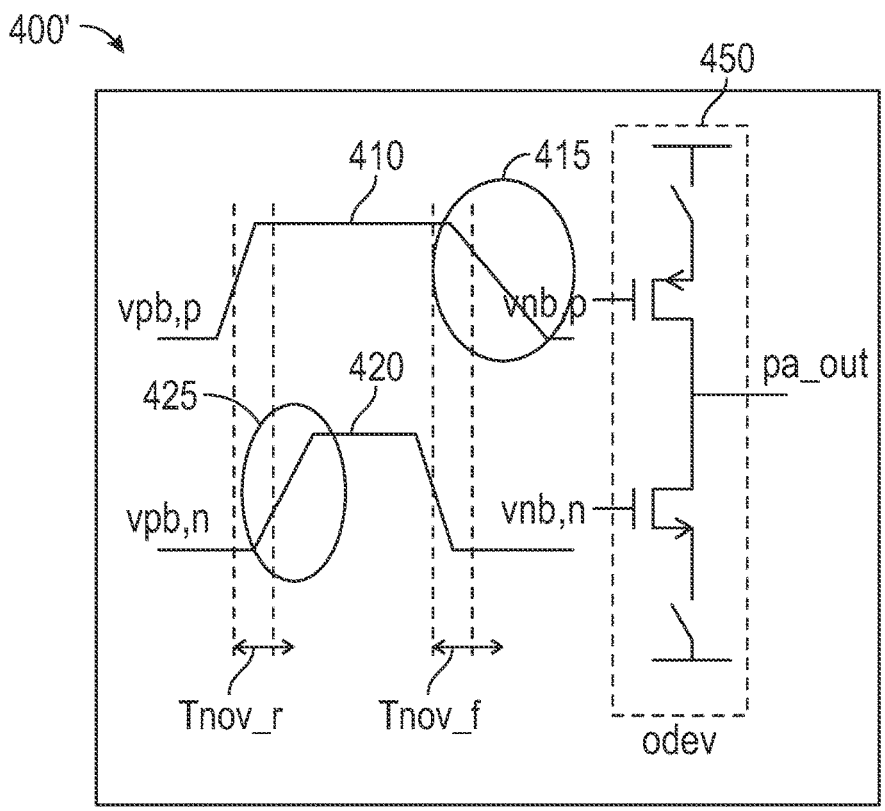
Figure 4C:
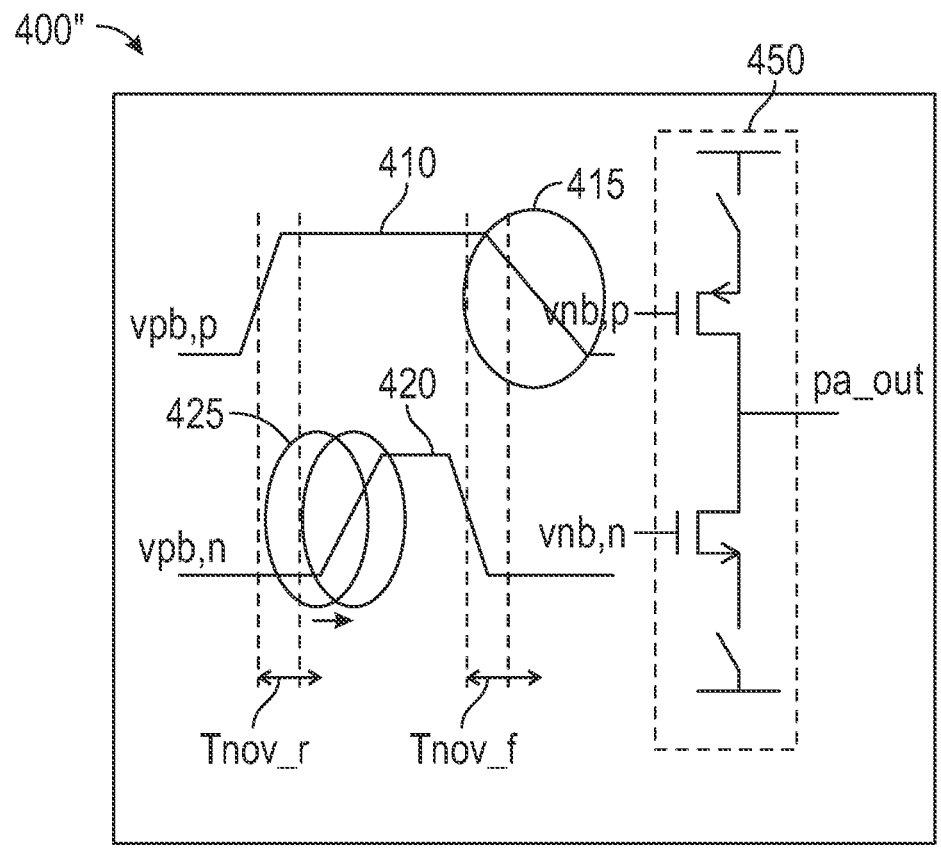

Referring now to FIGS. 4A-4C, shown are timing diagrams illustrating edge control signals in accordance with an embodiment. As shown in FIG. 4A, in a default configuration 400, two non-overlap waveforms may be implemented as transmit LO signals with edge control, that couple to gate terminals of MOSFETs. Specifically, a first edge control bias signal 410 (vpb,p (and vnb,p)) provides modulation for a drive output signal output from a P-side of a driver circuit of PA 450 (actual driver circuit not shown in FIG. 4A), and in turn, a second edge bias signal 420 (vpb,n (and vnb,n)) provides modulation for a drive output signal output from an N-side of the driver circuit of PA 450. Collectively, these signals affect the rising and falling edges. In a simplified sense, signal 410 affects the output due to a top MOSFET M1 of PA 450 and signal 420 affects the output due to the bottom MOSFET M2 of PA 450.

Note that FIG. 4A is shown at a high level, and in particular implementations, these edge control bias signals may couple to intervening circuitry such as a driver circuit, instead of being directly provided to the MOSFETs of an output circuit of PA 450. As illustrated in this default configuration, substantially equal rise and fall times exist and furthermore, there are substantially equal non-overlap times (Tnov) for both rise and fall times (more specifically Tnov_r, and Tnov_f). These default signal shapes can help to minimize harmonics and ground bounce with the edge rate control.

Instead as illustrated, first in FIG. 4B, in a first implementation 400', slowed edges may be provided for at least one each of the rise and fall times to help reduce higher harmonics (as illustrated at inserts 415, 425). Thus as shown, edge control bias signals vnb,p and vpb,n effectively slow the rising edge and falling edge at the output of the PA, respectively. While in FIG. 4B, only two edges are slowed rather than all four, different numbers of controlled edges can occur in other implementations. In a particular embodiment, only two edges are slowed down instead of four edges, and two edges are controlled for non-overlap, e.g., to reduce power supply rejection (PSR) impact and to reduce the effect of 6 edges mismatches. Thus in various embodiments, slowed edges for rise/fall times may be controlled to meet radiated harmonics requirements.

Referring now to FIG. 4C, shown is yet a further implementation 400" to provide edge control signals in accordance with an embodiment. As shown in FIG. 4C, in addition to controlling edge rates to be slowed, the non-overlap may be adjusted to ensure that the rise/fall times on the output of the PA are the same. As illustrated, the edge control signal vpb,n signal 420 may be shortened to provide a greater non-overlap at the output. Thus as shown, the effective non-overlap rise time (Tnov_r) increases. As will be described further below, the control of the edge rates and non-overlap may occur in a non-overlap generation circuit. However, understand that in various implementations there may be different edge rate and non-overlap profiles.

Figure 5A:
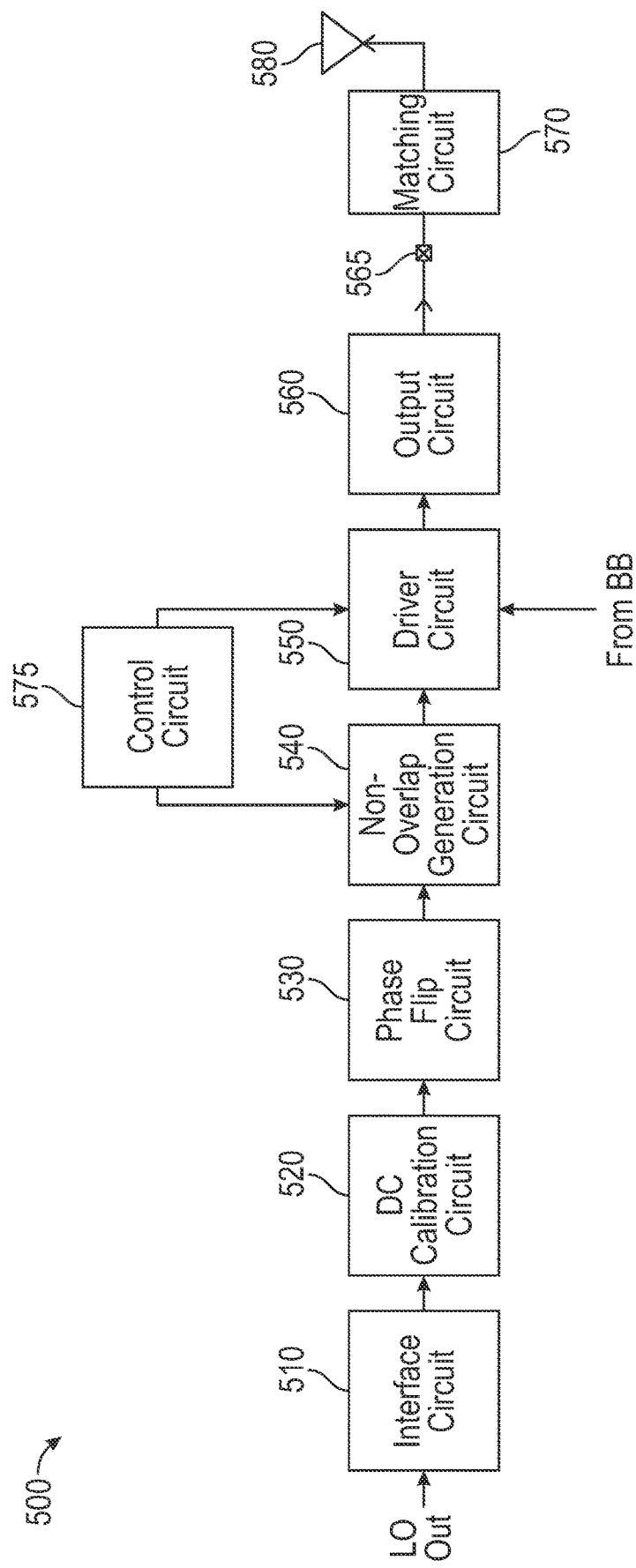
FIG. 5A is a block diagram of a portion of a wireless device in accordance with an embodiment.

Referring now to FIG. 5A, shown is a block diagram of a portion of a wireless device in accordance with an embodiment. In FIG. 5A, a transmitter of wireless device 500 is shown at a high level. As illustrated, an interface circuit 510 receives an incoming clock signal, e.g., from a local oscillator and provides it to a duty cycle (DC) calibration circuit 520 which may perform DC calibration on the signal. In an embodiment, the clock signal may be a square wave signal having a 50% duty cycle. Note that other duty cycle implementations are possible. As shown in FIG. 5A, the calibrated clock signal in turn is provided to a phase flip circuit 530 which may perform a phase flip.

Next, the clock signal is provided to a non-overlap generation circuit 540. In embodiments herein, non-overlap generation circuit 540 may generate transmit LO signals with edge control (e.g., in the form of non-overlap signals) that are used to drive NMOS and PMOS devices of a driver circuit and/or PA such as the representative Class D amplifier described herein. In a particular implementation, non-overlap generation circuit 540 may use configuration settings, e.g., as stored in a non-volatile memory, to generate the non-overlap signals that cause bias signals to have a programmable non-overlap. Thereafter, these transmit LO signals with edge control may be provided to a driver circuit 550, which further receives a signal to be transmitted (which may be received from a baseband processor which performs baseband processing, conversion to analog and so forth). Driver circuit 550 may be a driver stage of a PA which increases signal amplitude and results in drive signals that are provided to an output circuit 560, which may be implemented as a stack of PMOS and NMOS devices. The PA output couples through an output pin 565 through a matching network 570 to an antenna 580.

As further shown a control circuit 575 may be configured to generate bias and other control signals to be provided to driver circuit 550 and output circuit 560. In one or more implementations, control circuit 575 may include resistor ladders or other circuits to generate bias levels. In a particular implementation, control circuit 575 may use configuration settings, e.g., as stored in a non-volatile memory, to generate the bias signals having programmable rise/fall times. Understand while shown at this high level in the embodiment of FIG. 5A, many variations and alternatives are possible.

Figure 5B:
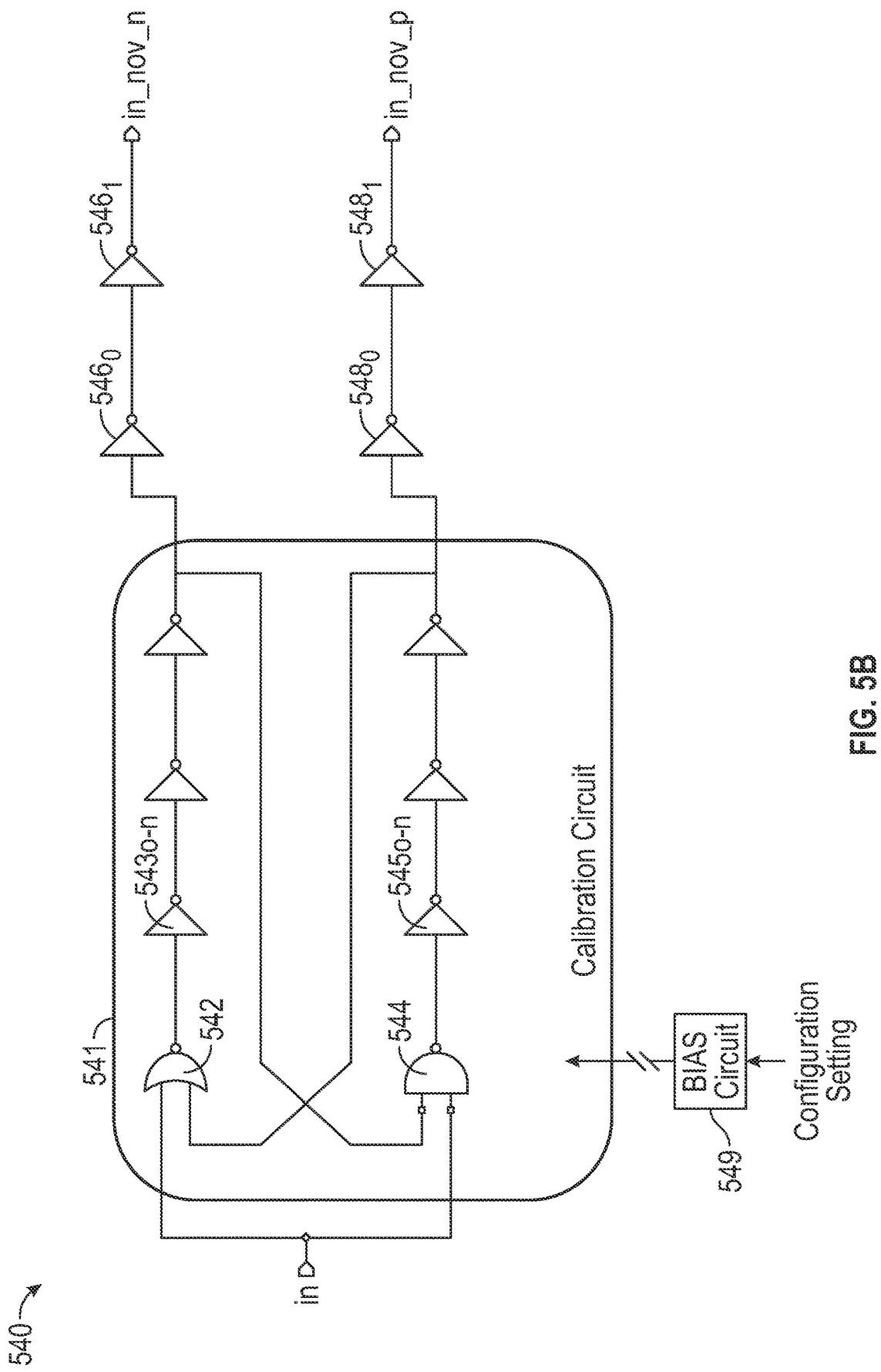
FIG. 5B is a schematic diagram of a non-overlap generation circuit in accordance with an embodiment.

Referring now to FIG. 5B, shown is a schematic diagram of a non-overlap generation circuit in accordance with an embodiment. As shown in FIG. 5B, circuit 540 is one implementation of the non-overlap generation circuit of FIG. 5A. As illustrated, an incoming clock signal is provided to two paths through a calibration circuit 541. Calibration circuit 541 may be configured, based on a given configuration setting to cause the bias signals described herein to be generated with programmable rise and fall times and programmable non-overlap. Depending upon implementation, these configuration settings may be fused values, e.g., as stored into fuses or other non-volatile storage of an integrated circuit. In one implementation, these values may be determined based on design, testing characterization and so forth. Once desired values are obtained, they may be fused into manufactured parts. In other cases, these configuration settings may be dynamically programmable based on desired settings for a particular wireless device.

In any event, control signals (e.g., 4 different control signals) generated from the configuration settings may be used to bias the various components within calibration circuit 540. To this end, configuration settings may be provided to a bias circuit 549, which may include resistor ladders or so forth to generate control signals that in turn can be provided to the various circuit components within calibration circuit 540 (specific coupling of these bias signals to each of the circuit elements is not shown for ease of illustration).

With reference to the top or first path, a NOR gate 542 receives the input (clock) signal and a feedback signal from the lower path. The resulting logic output signal is fed through a series of inverters $543_{0-N}$. As one example, there may be three such inverters to provide timing margin, where each of these inverters may be provided with a different bias voltage based on the configuration settings to generate the rise and fall edges as described herein. Similarly, the bottom or second path includes a NAND gate 544 to receive the input (clock) signal and a feedback signal from the upper path. The resulting logic output signal is fed through a series of inverters $545_{0-N}$.

With further reference to the top path, the signal output from the top path of calibration circuit 541 is fed through another pair of inverters 5460,1 to result in a first control signal, namely a first non-overlap signal which is used to drive one or more devices of a driver circuit and similarly the signal output from the bottom path of calibration circuit 541 is fed through another pair of inverters 5480,1 to result in a second control signal namely a second non-overlap signal which is used to drive one or more other devices of the driver circuit. These non-overlap signals (in_nov_p and in_nov_n) thus have modulated rising and falling edges of the signals, and are provided to P and N sides of a driver circuit.

Table 1 below illustrates control of programmable rise/fall times and non-overlap in accordance with one embodiment, where these features can be controlled based on configuration settings stored, e.g., in a fuse storage or other non-volatile memory.

TABLE 1

| Non-overlap time for Class D PMOS & NMOS | 4 bits for non-overlap time at rising edge 4 bits for non-overlap time at falling edge | 1) To avoid shoot through current in PMOS & NMOS 2) To decrease CVF losses in Class D 3) Improve harmonics |
|---|---|---|
| Rising edge & Falling edge of Pre-driver which drives output stage | 4 bits for rising edge 4 bits for falling edge | 1) Decrease ground bounce (A must have for 14 dBm/20 dBm single-ended Class D) 2) Improve harmonics |

In embodiments, a duty cycle of the bias signals may reduce as a higher calibration code is applied for both P-side and N-side of the PA. In one embodiment, the P-side duty cycle range is 92.5% to 53.5%, and the N-side duty cycle range is 46.2% to 3.1%.

Figure 6:
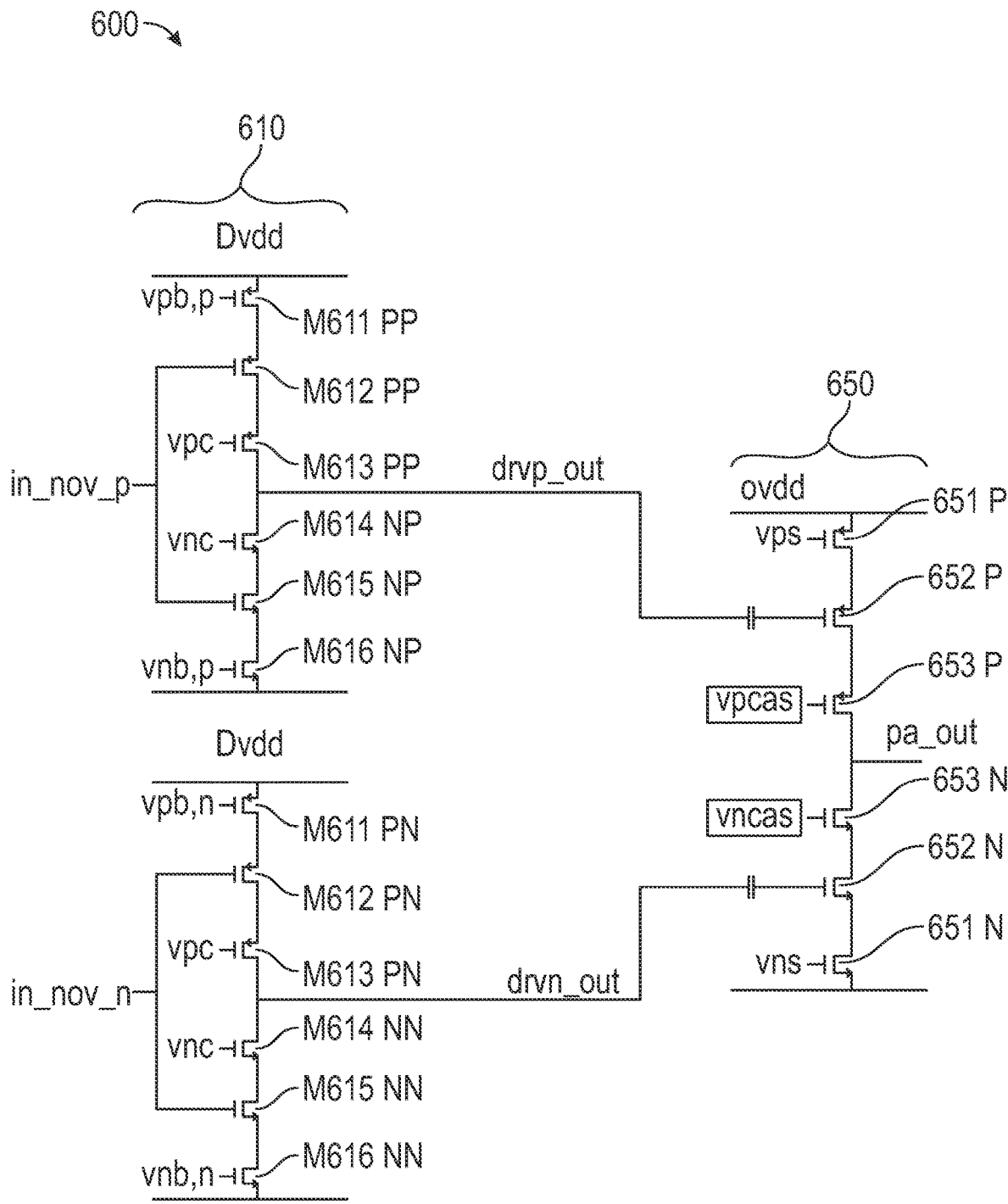
FIG. 6 is a schematic diagram of driver and output stages of a power amplifier in accordance with an embodiment.

Referring now to FIG. 6, shown is a schematic diagram of driver and output stages of a PA in accordance with an embodiment. As shown in FIG. 6, a PA may include a driver stage 610 and an output stage 650, where output stage 650 is implemented as a Class D amplifier.

With regard to driver stage 610, separate P and N side devices are present. Specifically, each side of driver stage 610 includes a stack of six driver PMOS (or NMOS) devices M611-M616 (with the particular nomenclature of 'PP,' 'NP' 'PN' or 'NN' for the PMOS and NMOS devices in the P and N sides of driver stage 610). As seen, control MOSFETs M611 PP, M616 NP are driven by the edge control bias signals (as shown in, e.g., FIG. 4A, namely vpb,p and vpb,n) that modulate the rising and falling edges of the output (drvp_out) of driver stage 610, based on the incoming in_nov_p waveform. The intermediate MOSFETs M612 PP, M615 NP are driven with an input non-overlap signal (in_nov_p). Finally, MOSFETS M613 PP, M614 NP may be driven with ramp signals vpc, vnc. These ramp signals are used to ramp of the output power (usually from a low/pedestal value) to a desired output power level (Pout) over a certain ramp time, while meeting output RF spurious requirements. This desired output power, Pout, is arrived over a certain ramp vs. time to achieve the full minimum Pout to maximum Pout range. In the embodiment of FIG. 6, ramp control is divided into two control knobs, one for the driver circuit and one for the output circuit. In different implementations, these ramp signal may be generated as an analog ramp and/or a digital ramp. The resulting output signals from driver stage 610 are provided as drive signal to MOSFETs within output device 650. Here, modulation of the falling edge of the output of driver stage 610 with the edge control bias signals corresponds to the modulation of the rising edge at the output of output device 650. Also, MOSFETs 652P and 652N correspond to some form of M1 and M2 respectively in FIGS. 2 and 4A.

Likewise, MOSFETs M611 PN, M616 NN are driven by the edge control bias signals (as shown in, e.g., FIG. 4A, namely vpb,n and vnb,n) that modulate the rising and falling edges of the output (drvn_out) of driver stage 610, drvn_out, based on the incoming in_nov_n waveform. Here, modulation of the rising edge of the output of driver stage 610 with the edge control bias signals corresponds to the modulation of the falling edge at the output of output device 650. The intermediate MOSFETs M612 PN, M615 NN are driven with an input non-overlap signal (in_nov_n). Finally, MOSFETS M613 PN, M614 NN may be driven with ramp signals vpc, vnc.

As illustrated with regard to output device 650, a further stack of amplifier PMOS and NMOS devices $M651_{N,P}$-$M653_{N,P}$ are provided. In addition to the drive signals output from driver stage 610, which drive MOSFETs M652, a protection signal is provided to cascode devices M653, and a select signal vps, vns is provided to MOSFETs 651, e.g., based on slice/stripe configuration of the PA).

Of course in other embodiments, a fully differential implementation is possible by generating drvp_outn and drvn_outn signals for the P-side and N-side of the RF-output, pa_outn. In that case, the signals shown above as drvp_out and drvn_out would be drvp_outp and drvn_outp for the P-side and N-side of the RF+output, pa_outp. Its impact on ground bounce can however be lower for differential designs while controlling the harmonic content. The techniques can be applied to other classes of power amplifiers as is fundamental to lowering the harmonic content around the notch frequencies of interest, where self-resonance due to the package and trace can happen.

Figure 7:
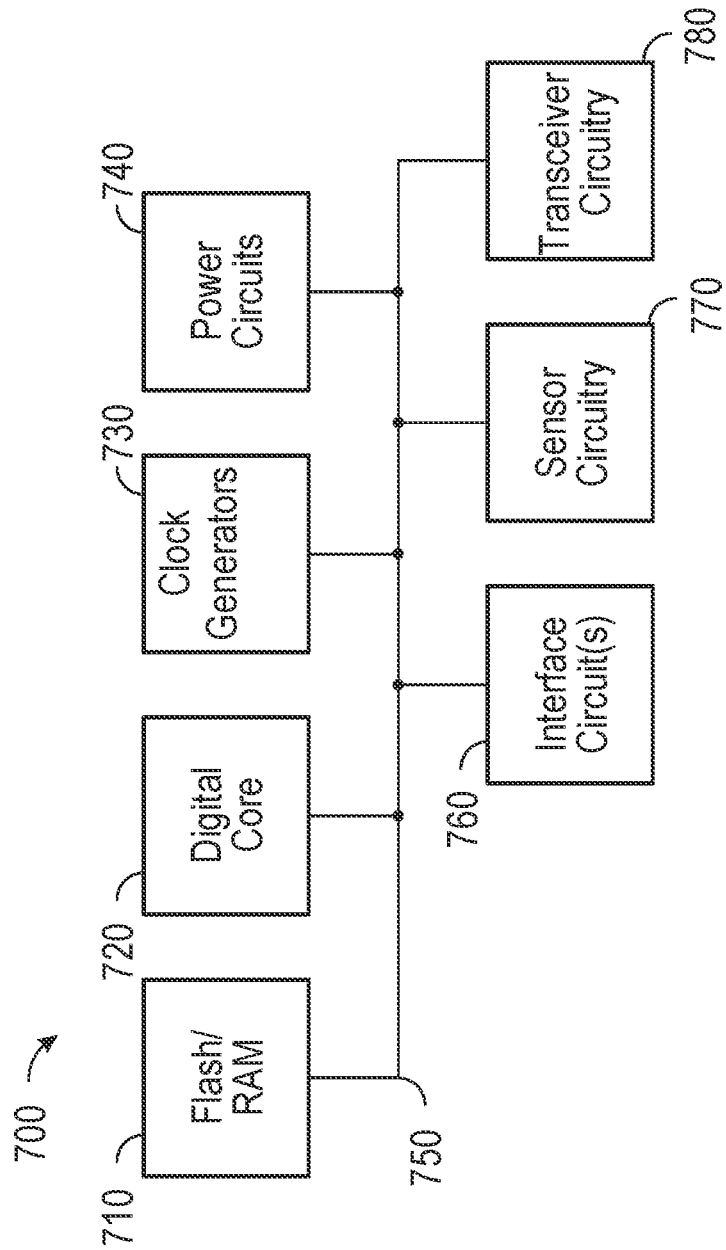
FIG. 7 is a block diagram of a representative integrated circuit in accordance with an embodiment.

Embodiments can be implemented in many different environments. Referring now to FIG. 7, shown is a block diagram of a representative integrated circuit 700 that can be configured for controlling edge rates and non-overlap to reduce harmonics and ground bounce, as described herein. In the embodiment shown in FIG. 7, integrated circuit 700 may be, e.g., a microcontroller, wireless transceiver that may operate according to one or more wireless protocols (e.g., WLAN-OFDM, WLAN-DSSS, Bluetooth, among others), or other device that can be used in a variety of use cases, including sensing, metering, monitoring, embedded applications, communications, applications and so forth, and which may be particularly adapted for use in an IoT device.

In the embodiment shown, integrated circuit 700 includes a memory system 710 which in an embodiment may include a non-volatile memory such as a flash memory and volatile storage, such as RAM. In an embodiment, this non-volatile memory may be implemented as a non-transitory storage medium that can store instructions and data. Such non-volatile memory may store instructions and data, including such information for controlling edge rates and non-overlap in accordance with an embodiment.

Memory system 710 couples via a bus 750 to a digital core 720, which may include one or more cores and/or microcontrollers that act as a main processing unit of the integrated circuit. In turn, digital core 720 may couple to clock generators 730 which may provide one or more phase locked loops or other clock generator circuitry to generate various clocks for use by circuitry of the IC.

As further illustrated, IC 700 further includes power circuitry 740, which may include one or more voltage regulators. Additional circuitry may optionally be present depending on particular implementation to provide various functionality and interaction with external devices. Such circuitry may include interface circuitry 760 which may provide interface with various off-chip devices, sensor circuitry 770 which may include various on-chip sensors including digital and analog sensors to sense desired signals, such as for a metering application or so forth.

In addition as shown in FIG. 7, transceiver circuitry 780 may be provided to enable transmission and receipt of wireless signals, e.g., according to one or more of a local area or wide area wireless communication scheme, such as Zigbee, Bluetooth, IEEE 802.11, IEEE 802.15.4, cellular communication or so forth. Understand while shown with this high-level view, many variations and alternatives are possible.

Note that ICs such as described herein may be implemented in a variety of different devices such as an IoT device. This IoT device may be, as two examples, a smart bulb of a home or industrial automation network or a smart utility meter for use in a smart utility network, e.g., a mesh network in which communication is according to an IEEE 802.15.4 specification or other such wireless protocol.

Figure 8:
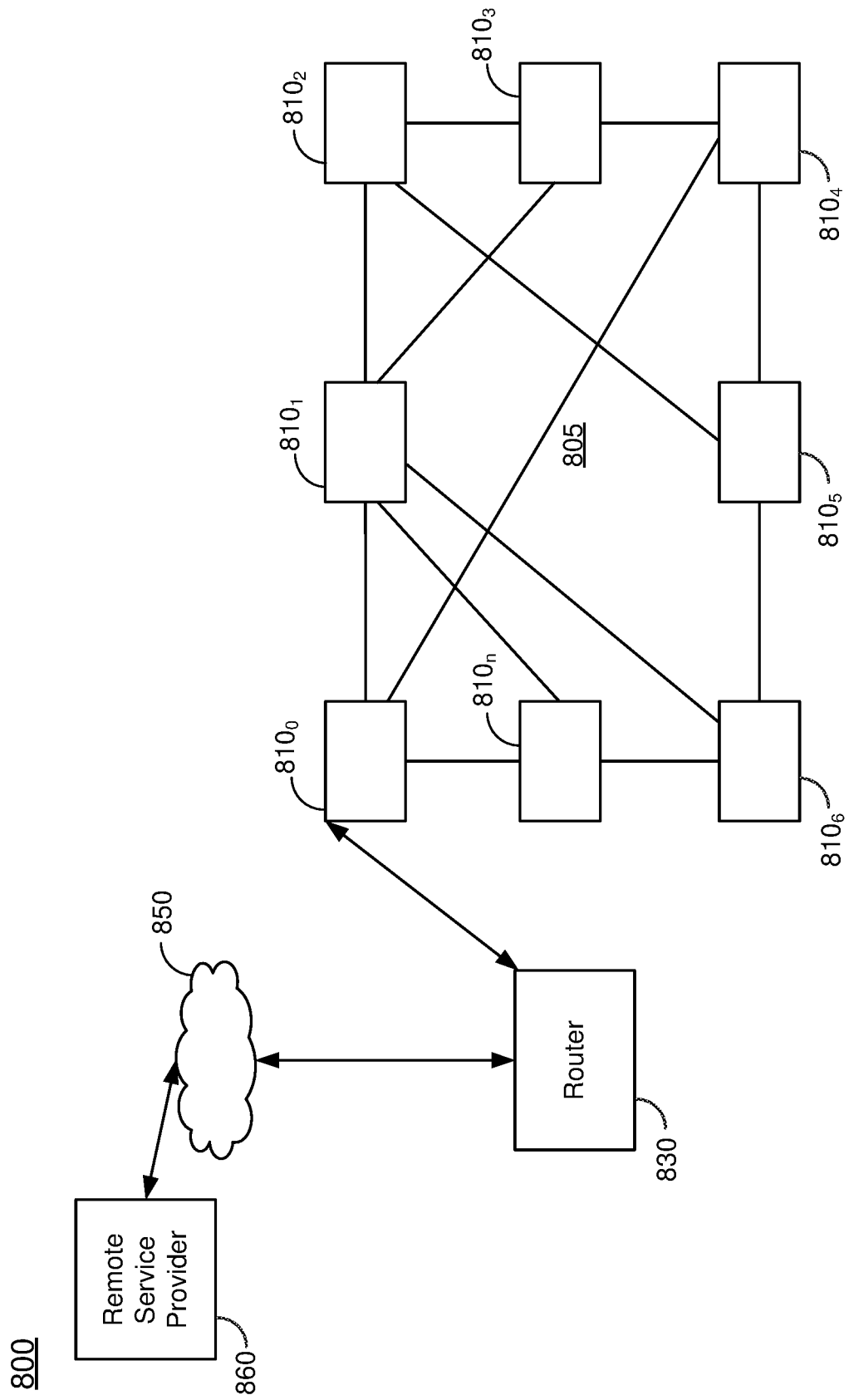
FIG. 8 is a block diagram of a system in accordance with an embodiment.

Referring now to FIG. 8, shown is a high-level diagram of a network in accordance with an embodiment. As shown in FIG. 8, a network 800 includes a variety of devices, including smart devices such as IoT devices, routers and remote service providers. In the embodiment of FIG. 8, a mesh network 805 may be present, e.g., in a building having multiple IoT devices 8100-*n*. Such IoT devices may include transmitter having programmable control of edge rates and/or non-overlap of control signals, to reduce harmonics and/or ground bounce as described herein. As shown, at least one IoT device 810 couples to a router 830 that in turn communicates with a remote service provider 860 via a wide area network 850, e.g., the internet. In an embodiment, remote service provider 860 may be a backend server of a utility that handles communication with IoT devices 810. Understand while shown at this high level in the embodiment of FIG. 8, many variations and alternatives are possible.

With embodiments providing bias signals having slower edge rates (in at least some of the signals) and greater non-overlapping, reduced current harmonics and ground bounce is realized. Embodiments thus may lower harmonic current and ground bounce with slope controls and non-overlap of drive signals.

While the present disclosure has been described with respect to a limited number of implementations, those skilled in the art, having the benefit of this disclosure, will appreciate numerous modifications and variations therefrom. It is intended that the appended claims cover all such modifications and variations.

What is claimed is:

1. An apparatus comprising:
a driver circuit to receive first and second ramp signals and output first and second drive signals under control of a first bias signal and a second bias signal, the first bias signal having a first edge and a second edge, the second edge having a different edge rate than the first edge, the second bias signal having an asymmetric non-overlap with the first bias signal; and
an output circuit coupled to the driver circuit, the output circuit comprising at least one first active device to be driven by the first drive signal and at least one second active device to be driven by the second drive signal, wherein the output circuit is to amplify and output a radio frequency (RF) signal.

2. The apparatus of claim 1, further comprising a control circuit to generate the first bias signal and the second bias signal based at least in part on a first configuration setting.

3. The apparatus of claim 2, further comprising a non-volatile storage to store the first configuration setting, the first configuration setting comprising a multi-bit value to control the edge rate of at least the second edge.

4. The apparatus of claim 3, wherein the non-volatile storage is to be written during manufacture with the first configuration setting.

5. The apparatus of claim 2, wherein the control circuit is to generate the second bias signal having the asymmetric non-overlap with the first bias signal.

6. The apparatus of claim 5, wherein the control circuit is to generate the asymmetric non-overlap according to a second configuration setting.

7. The apparatus of claim 6, wherein the control circuit comprises a calibration circuit to receive a clock signal and to generate a first non-overlap signal and a second non-overlap signal, based on the clock signal and the second configuration setting.

8. The apparatus of claim 7, wherein the calibration circuit comprises:
a first path having a first logic circuit and a first delay circuit to generate the first non-overlap signal; and
a second path having a second logic circuit and a second delay circuit to generate the second non-overlap signal.

9. The apparatus of claim 8, wherein the first delay circuit has a first programmable delay and the second delay circuit has a second programmable delay, the first programmable delay different than the second programmable delay.

10. The apparatus of claim 7, wherein the driver circuit comprises:
a first stack of driver devices to receive the first bias signal, the first non-overlap signal, and the first ramp signal, the first stack of driver devices to output the first drive signal; and
a second stack of driver devices to receive the second bias signal, the second non-overlap signal, and the second ramp signal, the second stack of driver devices to output the second drive signal.

11. A method comprising:
receiving, in a driver circuit of a transmitter, first and second ramp signals and outputting first and second drive signals under control of a first bias signal and a second bias signal, the first bias signal having a first edge and a second edge, the second edge having a different edge rate than the first edge, the second bias signal having an asymmetric non-overlap with the first bias signal; and in a power amplifier of the transmitter, amplifying and outputting a radio frequency (RF) signal, the power amplifier comprising at least one first active device driven by the first drive signal and at least one second active device driven by the second drive signal.

12. The method of claim 11, further comprising:
generating the first bias signal and the second bias signal; and controlling the edge rate of at least the second edge based at least in part on a first configuration setting, the first configuration setting stored in a non-volatile memory.

13. The method of claim 11, further comprising:
generating the first bias signal with the second edge having a slower edge rate than the first edge, the first edge comprising a rising edge and the second edge comprising a falling edge; and reducing at least one of ground bounce or harmonic current by providing the second edge having the slower edge rate than the first edge.

14. The method of claim 11, further comprising:
generating the first bias signal having the asymmetric non-overlap with the second bias signal; and reducing at least one of ground bounce or harmonic current by providing the first bias signal having the asymmetric non-overlap with the second bias signal.

15. The method of claim 11, further comprising:
controlling at least one of a rise time or a fall time of the first bias signal and the second bias signal according to a first configuration setting; and controlling a non-overlap of the first bias signal with the second bias signal according to a second configuration setting.

16. The method of claim 11, further comprising outputting the RF signal comprising a single-ended RF signal, the power amplifier comprising a single-ended Class D amplifier.

17. A wireless device comprising:
a baseband circuit to receive message information and process the message information;

radio frequency (RF) circuitry coupled to the baseband circuit to convert the message processed information into a RF signal; and a power amplifier coupled to the RF circuitry, the power amplifier having a first node to couple to a supply voltage node and a second node to couple to a ground voltage node, the power amplifier to receive and amplify the RF signal, the power amplifier comprising:
  a first stage to receive first and second ramp signals and output first and second drive signals under control of a first bias signal and a second bias signal, at least one of the first bias signal or the second bias signal having at least one asymmetric edge rate, the second bias signal having an asymmetric non-overlap with the first bias signal; and
  a second stage comprising at least one first active device to be driven by the first drive signal and at least one second active device to be driven by the second drive signal, to output the RF signal comprising a single-ended RF signal.

18. The wireless device of claim 17, further comprising a non-volatile storage to store a first configuration setting to cause the first bias signal and the second bias signal to have the at least one asymmetric edge rate.

19. The wireless device of claim 18, wherein the non-volatile storage further is to store a second configuration setting to cause the non-overlap between the first bias signal and the second bias signal, the wireless device further comprising a calibration circuit to generate a first non-overlap signal and a second non-overlap signal based at least in part on the second configuration setting, wherein the first stage is further to receive the first non-overlap signal and the second non-overlap signal and provide the first drive signal and the second drive signal to the second stage based at least in part on the first and second non-overlap signals.

20. The wireless device of claim 17, wherein the power amplifier comprises a single-ended Class D amplifier, and wherein during transmission of the RF signal a ground bounce at the ground voltage node is to be less than approximately 100 millivolts.

\* \* \* \* \*